United States Patent
Li et al.

(10) Patent No.: US 10,734,803 B2
(45) Date of Patent: Aug. 4, 2020

(54) TRAVELLING WAVE PROTECTION OF A TRANSMISSION LINE BASED ON HIGH-PASS FILTERING

(71) Applicant: ABB Power Grids Switzerland AG, Baden (CH)

(72) Inventors: YouYi Li, Västerås (SE); Kai Liu, Beijing (CN); Jianping Wang, Västerås (SE)

(73) Assignee: ABB Power Grids Switzerland AG, Baden (CH)

( * ) Notice: Subject to any disclaimer, the term of this patent is extended or adjusted under 35 U.S.C. 154(b) by 226 days.

(21) Appl. No.: 15/574,390

(22) PCT Filed: May 26, 2015

(86) PCT No.: PCT/EP2015/061597
§ 371 (c)(1),
(2) Date: Nov. 15, 2017

(87) PCT Pub. No.: WO2016/188568
PCT Pub. Date: Dec. 1, 2016

(65) Prior Publication Data
US 2018/0145505 A1    May 24, 2018

(51) Int. Cl.
*G01R 31/08* (2020.01)
*H02H 7/26* (2006.01)
*G01R 31/11* (2006.01)
*G01R 23/167* (2006.01)
*H02H 1/00* (2006.01)
(Continued)

(52) U.S. Cl.
CPC .......... *H02H 7/265* (2013.01); *G01R 23/167* (2013.01); *G01R 31/08* (2013.01); *G01R 31/11* (2013.01); *H02H 1/0007* (2013.01); *H02H 3/44* (2013.01); *G01R 31/085* (2013.01); *G01R 31/40* (2013.01); *H02H 7/268* (2013.01)

(58) Field of Classification Search
USPC ....................................... 361/62–69
See application file for complete search history.

(56) References Cited

U.S. PATENT DOCUMENTS

| 3,878,460 A | 4/1975 | Nimmersjo |
| 5,272,439 A | 12/1993 | Mashikian et al. |
| 8,742,765 B2 | 6/2014 | Kojovic et al. |

(Continued)

FOREIGN PATENT DOCUMENTS

| CN | 100583590 C | 1/2010 |
| CN | 103245870 A | 8/2013 |

OTHER PUBLICATIONS

International Preliminary Report of Patentability Application No. PCT/EP2015/061597 dated Oct. 4, 2017 6 pages.
(Continued)

*Primary Examiner* — Danny Nguyen
(74) *Attorney, Agent, or Firm* — Slater Matsil, LLP

(57) ABSTRACT

There is provided mechanisms for travelling wave protection of a transmission line. A method includes performing high-pass filtering of a current and/or voltage measurement of a transmission line so as to detect fault-caused high-frequency components of the current and/or voltage measurement. The method includes providing a result of the high-pass filtering as input to a trip decision maker performing travelling wave detection.

19 Claims, 3 Drawing Sheets

(51) Int. Cl.
*H02H 3/44* (2006.01)
*G01R 31/40* (2020.01)

(56) References Cited

U.S. PATENT DOCUMENTS

| | | |
|---|---|---|
| 2006/0012374 A1 | 1/2006 | Kojovic et al. |
| 2011/0063767 A1* | 3/2011 | Kasztenny ............... H02H 3/28 361/66 |
| 2013/0015878 A1 | 1/2013 | Perera et al. |
| 2015/0081236 A1* | 3/2015 | Schweitzer, III ...... G01R 27/16 702/59 |
| 2018/0301894 A1* | 10/2018 | Ha ........................ H02H 7/265 |

OTHER PUBLICATIONS

International Search Report and Written Opinion of the International Searching Authority Application No. PCT/EP2015/061597 Completed: Jan. 27, 2016; dated Feb. 4, 2016 12 pages.
Written Opinion of the International Preliminary Examining Authority Application No. PCT/EP2015/061597 dated May 11, 2017 6 pages.

* cited by examiner

TRAVELLING WAVE PROTECTION OF A TRANSMISSION LINE BASED ON HIGH-PASS FILTERING

TECHNICAL FIELD

Embodiments presented herein relate to travelling wave protection of a transmission line, and particularly to a method and an arrangement for travelling wave protection of a transmission line.

BACKGROUND

Consider a regional power system having a strong internal transmission system transmitting power to another strong regional system on relatively weak Interties. Such a regional power system may experience issues with stability during disturbances, such as short circuits, loss of generation, loss of load, loss of one of the Interties, or any combination thereof. Prevalent practice to the solution of these issues is to include more Interties, increase the voltage to higher voltage levels (such as extra high voltage (EHV) levels or ultra high voltage (UHV) levels), or both. Another approach for better power system stability is to employ protection relays with high operation speed.

Travelling wave protection is one approach for super-high speed protection. There are different types of travelling wave protections, for example, travelling wave pilot protection based on directional comparison, travelling wave current differential protection, travelling wave protection based on distance measurements, etc.

Directional pilot protection is one of the most practical and reliable solutions for travelling wave protection. It only needs a small bandwidth channel to transmit binary information between terminals at end points of a transmission line. It can detect the fault direction based on local measurements, which can block the mal-trip on external fault in reverse direction even with wrong communication.

One travelling wave protection mechanism is RALDA for US Bonneville's 500 kV transmission line. Properties of such a travelling wave protection mechanism are, for example, disclosed in U.S. Pat. No. 3,878,460 (A). U.S. Pat. No. 3,878,460 (A) relates to an arrangement for detecting the direction of a fault from a measuring point. In short, in RALDA the polarities of the first wave fronts of local voltage and current are compared. If the polarities are the same, a backward fault is detected. If the polarities are each others reverse, a forward fault is detected. Protection relays at a terminal will transmit the fault direction to other terminals. If both directions are forward directions, it means that an internal fault has occurred. Otherwise, it means that an external fault has occurred.

However, the security of travelling wave protection mechanisms such as RALDA may be influenced by harmonics. Under some conditions, the harmonics may lead to wrong detection of forward faults at both sides of the protected line, and thereby, it may finally lead to mal-trip according to the directional pilot protection principle. So, there is still a need for an improved protection of a transmission line.

SUMMARY

An object of embodiments herein is to provide efficient protection of a transmission line.

The inventor of there herein disclosed embodiments has discovered that one issue with RALDA based travelling wave protection mechanisms relates to harmonics. In more detail, a low-pass filter and some band-stop filters are used in RALDA to filter the travelling wave components. In modern power system, with more and more FACTS (Flexible Alternate Current Transmission Systems), HVDC (High Voltage Direct Current) and other harmonics resources, the harmonics are complex and may be sub-harmonics. It is impossible, or at least cumbersome, to remove all the harmonics by pre-setting the band-stop filters. As a result, in RALDA the harmonics may be treated as travelling waves, which may lead to mal-operations in some cases when such "false" travelling waves indicate wrong forward fault directions from terminals at both ends of the transmission line.

The inventor of there herein disclosed embodiments has discovered that disturbances caused by harmonics and faults have different of spectrum features. Normally, the spectrum of a fault caused disturbance wave includes lots of high frequency components. But the spectrum of the typical harmonics in a power system does not include such high frequency components. Such a difference can be used to distinguish faults from harmonics and in order to block a potential mal-trip.

According to a first aspect there is presented a method for travelling wave protection of a transmission line. The method comprises performing high-pass filtering of a current and/or voltage measurement of a transmission line so as to detect fault-caused high-frequency components of said current and/or voltage measurement. The method comprises providing a result of said high-pass filtering as input to a trip decision maker performing travelling wave detection.

Advantageously this provides blocking of potential mal-trips that would otherwise have been caused by harmonics in the current and/or voltage measurement.

Advantageously this enables secure travelling wave protection.

According to a second aspect there is presented an arrangement for travelling wave protection of a transmission line. The arrangement comprises a processing unit. The processing unit is configured to cause the arrangement to perform high-pass filtering of a current and/or voltage measurement of a transmission line so as to detect fault-caused high-frequency components. The processing unit is configured to cause the arrangement to provide a result of said high-pass filtering as input to a trip decision maker performing travelling wave detection.

According to a third aspect there is presented a computer program for travelling wave protection of a transmission line, the computer program comprising computer program code which, when run on a processing unit of an arrangement, causes the arrangement to perform a method according to the first aspect.

According to a fourth aspect there is presented a computer program product comprising a computer program according to the third aspect and a computer readable means on which the computer program is stored.

It is to be noted that any feature of the first, second, third and fourth aspects may be applied to any other aspect, wherever appropriate. Likewise, any advantage of the first aspect may equally apply to the second, third, and/or fourth aspect, respectively, and vice versa. Other objectives, features and advantages of the enclosed embodiments will be apparent from the following detailed disclosure, from the attached dependent claims as well as from the drawings.

Generally, all terms used in the claims are to be interpreted according to their ordinary meaning in the technical field, unless explicitly defined otherwise herein. All references to "a/an/the element, apparatus, component, means, step, etc." are to be interpreted openly as referring to at least one instance of the element, apparatus, component, means, step, etc., unless explicitly stated otherwise. The steps of any method disclosed herein do not have to be performed in the exact order disclosed, unless explicitly stated.

BRIEF DESCRIPTION OF THE DRAWINGS

The inventive concept is now described, by way of example, with reference to the accompanying drawings, in which.

DETAILED DESCRIPTION

The inventive concept will now be described more fully hereinafter with reference to the accompanying drawings, in which certain embodiments of the inventive concept are shown. This inventive concept may, however, be embodied in many different forms and should not be construed as limited to the embodiments set forth herein; rather, these embodiments are provided by way of example so that this disclosure will be thorough and complete, and will fully convey the scope of the inventive concept to those skilled in the art. Like numbers refer to like elements throughout the description. Any step or feature illustrated by dashed lines should be regarded as optional.

As noted above there are issues with existing mechanisms for travelling wave protection.

For example, U.S. Pat. No. 3,878,460 (A) discloses to use a band exclusion filter (also known as a band-stop filter) for removing the part of a signal which has the operating frequency of the network. However, the harmonics cannot always be totally removed by pre-setting the exclusion filter. This may lead to mal-trips. One object of embodiments presented herein is to resolve this issue.

The present invention overcomes the above mentioned issues by noting that for a power distribution system with presence of heavy harmonics (during normal operation without faults), the output of the RALDA filter may not be zero if the frequencies of the harmonics are not covered by its band-stop filters.

The present invention overcomes the above mentioned issues by noting that the frequency distribution of the harmonics is mainly in the low frequency range, for example, below 650 Hz. If there is only load and harmonics without fault, the values of high frequency components are very small compared with low frequency components.

The present invention overcomes the above mentioned issues by noting that for a power system with faults (either internal faults or external faults), there are lots of high frequency components from fault transients, especially in the beginning of the faults.

The present invention overcomes the above mentioned issues by noting that the difference between harmonics and fault transients can be used for travelling wave protection purposes to block unnecessary mal-trips (based on harmonics).

Figure 5:
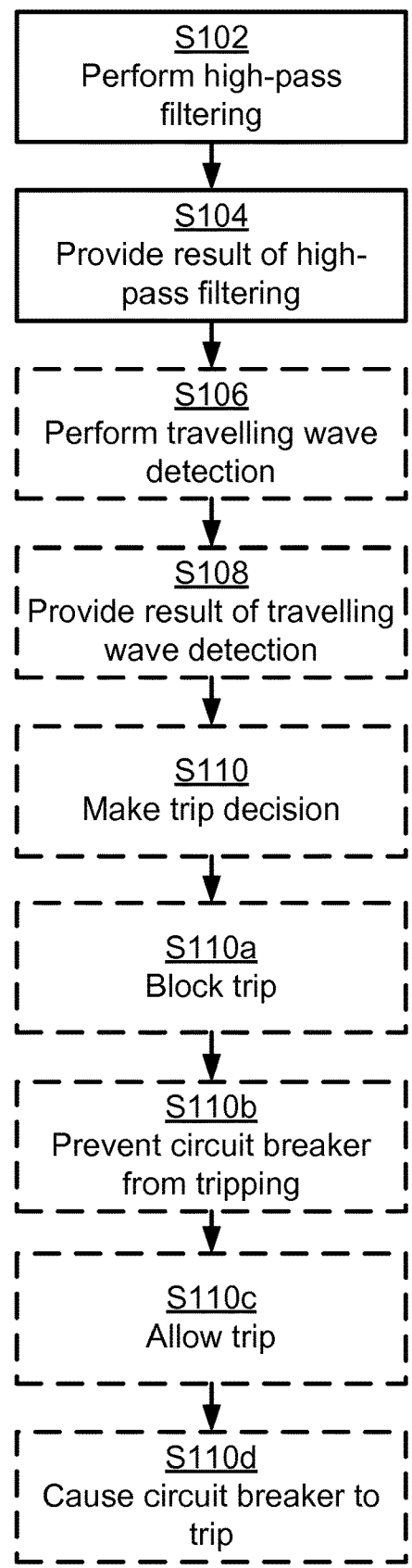
FIG. 5 is a flowchart of methods according to embodiments.

Hence, there is provided a method for travelling wave protection of a transmission line. The method is performed by an arrangement 10a, 10b. Reference is now made to the flowchart of FIG. 5. Parallel reference is made to the power distribution system 25 of FIG. 1 disclosing an embodiment wherein the herein disclosed invention may be applied.

The power distribution system 25 comprises at least one arrangement 10a, 10b for travelling wave protection of the transmission line 20. Two or more arrangements 10a, 10b may be operatively connected via a communications link 23. Further, two or more arrangements 10a, 10b may be part of a common arrangement 10c for travelling wave protection of the transmission line 20. The arrangement 10a, 10b may be part of, or comprise, an intelligent electronic device (IED) operating as a relay. The power distribution system 25 further comprises power sources 21a, 21b, current and voltage transformers 22a, 22b, and circuit breakers 23a, 23b. $F_1$ and $F_2$ denote faults along the transmission line 20. Examples of faults $F_1$, $F_2$ will be disclosed below.

Figure 1:
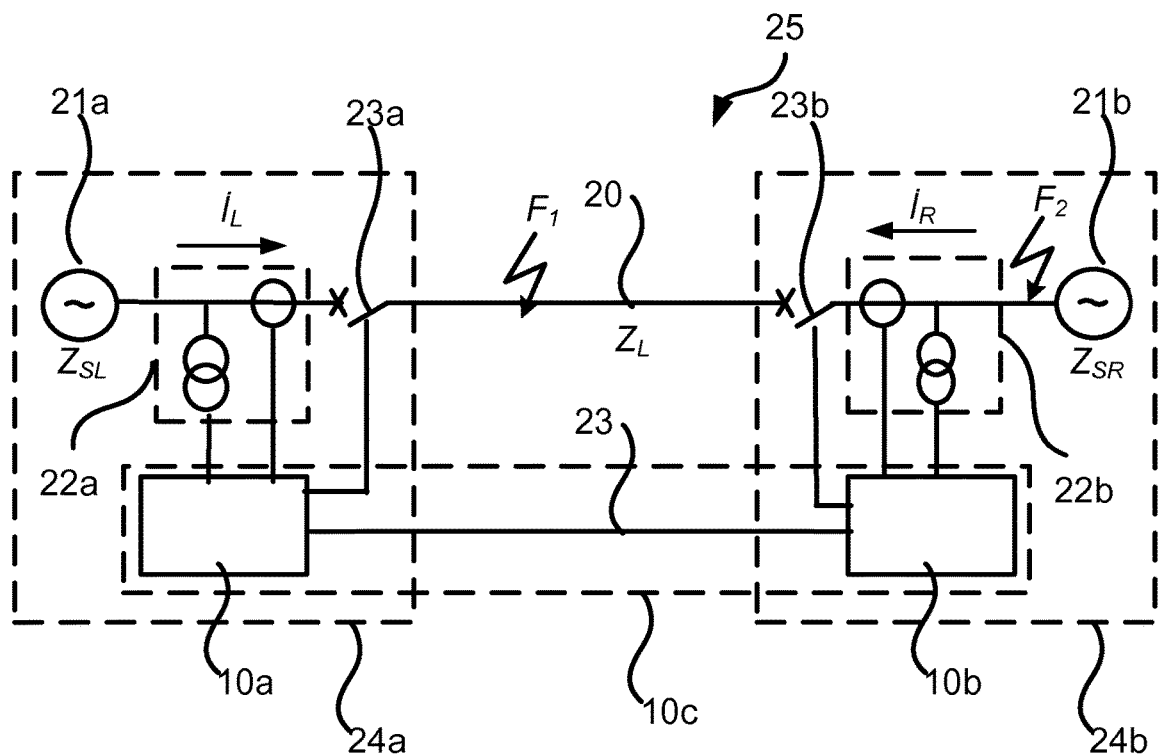
FIG. 1 is a schematic diagram illustrating a power distribution system according to embodiments.

The method comprises, in a step S102, performing high-pass filtering of a current and/or voltage measurement of the transmission line 20. The high-pass filtering is performed so as to detect fault-caused high-frequency components of the current and/or voltage measurement. As illustrated in FIG. 1, the arrangement 10a, 10b may acquire the current and/or voltage measurement from the current and voltage transformers 22a, 22b. Hence, arrangement 10a may receive current and/or voltage measurement from current and voltage transformer 22a, and arrangement 10b may receive current and/or voltage measurement from current and voltage transformer 22b. Arrangement 10c may transmit the current and/or voltage measurements and/or other control information between arrangements 10a and 10b. According to one embodiment the high-pass filter has a cut-off frequency which is higher than the highest frequency of the harmonics in the transmission system where the travelling wave protections are installed. For example, if the operating frequency of the power system is 50 Hz and the highest order harmonic is the 13th order harmonic, the highest frequency of the harmonics is 650 Hz. Thereby, the cut-off frequency of the high-pass filter should be higher than 650 Hz, for example 1 k Hz to make sure that the output of the high-pass filter will not be influenced by the harmonics. Hence, according to an embodiment the cut-off frequency of the high-pass filter is at least 650 Hz, preferably 1 kHz.

The result of the high-pass filtering is used for making a trip decision. Hence, the method comprises, in a step S104, providing a result of the high-pass filtering as input to a trip decision maker 14 performing travelling wave protection.

The result of the high-pass filtering may thereby define a simple blocking or unblocking function. As will be further disclosed below, this may prevent a travelling wave protection mechanism from making mal-trips on harmonics, even when there is a large output from the state-of-the-art travelling wave detection mechanism as caused by harmonics. The security of the travelling wave protection will thereby be improved. In more detail, the high frequency components detected by the high-pass filtering in step S104 are used detect faults, and not harmonics, of the current and/or voltage measurement. The harmonics are normally relatively low frequency components (e.g. <1 kHz), and the high-pass filter is thus designed to detect any disturbances caused by faults. Faults will cause both low frequency and high frequency components. The detected fault may be an internal fault or an external fault. Trip decision logics will further detect if the fault is an internal fault. And only for an internal fault, the protection will trip a circuit breaker.

Embodiments relating to further details of the herein disclosed method and arrangement for travelling wave protection of a transmission line will now be disclosed. General references are continued to the flowchart of FIG. 5 and the power distribution system 25 of FIG. 1.

As noted above, the high-pass filtering may be combined with state-of-the-art travelling wave detection to provide a travelling wave protection mechanism. According to an embodiment the method therefore comprises an optional step S106 of performing travelling wave detection of the transmission line 20 based on the current and/or voltage measurement. This travelling wave detection may thus be regarded as state-of-the-art travelling wave detection. According to one embodiment the travelling wave detection uses a RALDA filter or other kinds of travelling wave detection mechanisms. The result of the travelling wave detection is also used for making the trip decision. According to this embodiment the method therefore comprises an optional step S108 of providing a result of the travelling wave detection as input to the trip decision maker 14.

Hence, the trip decision maker 14 will then receive input from both the high-pass filtering performed in step S102 and the travelling wave detection performed in step S106.

Figure 2:
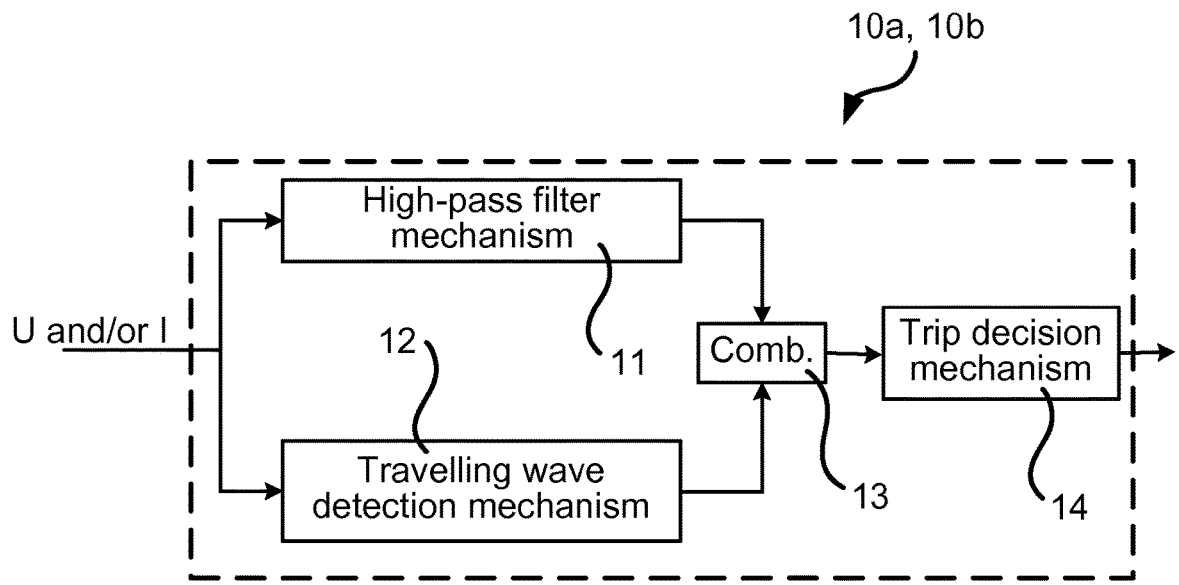
FIG. 2 is a schematic diagram illustrating an arrangement according to an embodiment.

Special reference is first made to FIG. 2 schematically illustrating an arrangement 10*a*, 10*b* as in FIG. 1 according to an embodiment. FIG. 2*a* schematically illustrates an arrangement 10*a*, 10*b* comprising a high-pass filter mechanism 11, which may implement steps S102 and S104, and a travelling wave detection mechanism 12 which may implement steps S106 and S108. The result of the high-pass filtering performed by the high-pass filter mechanism in step S102 and the result of the travelling wave detection performed by the travelling wave detection mechanism 12 in step S106 may be combined.

In FIG. 2 this combining is provided by a combining mechanism 13 which may be implemented as a logical "AND"-block. The output of the combining mechanism 13 is provided to the trip decision mechanism 14 where a trip decision is made. Hence, the method may comprise, in an optional step S110, making a trip decision based on the result of the travelling wave detection (as in step S106) and the result of the high-pass filtering (as in step S102).

There may be different ways to execute the trip decision. According to an embodiment the trip decision relates to whether or not to cause a circuit breaker 23*a*, 23*b* to trip.

There may be different ways to determine whether or not to cause the circuit breaker 23*a*, 23*b* to trip. Different embodiments relating thereto will now be described in turn.

In general terms, a trip may be blocked if the magnitude of the high frequency components as detected in step S104 is smaller than some threshold; and the trip may be allowed if the magnitude of the high frequency components as detected in step S104 is larger than this threshold.

According to an embodiment, making the trip decision comprises, in a step S110*a*, blocking a trip. The trip is blocked if certain conditions are fulfilled. One condition is that a trip indicated by the travelling wave detection is blocked if the trip is caused by the harmonics of the current and/or voltage measurement. The travelling wave protection function will thereby be blocked if there is not enough high frequency component(s) in the current and/or voltage measurement. Further, blocking the trip may comprise, step S110*b*, preventing the circuit breaker from tripping.

According to an embodiment, making the trip decision comprises, in a step S110*c*, allowing a trip. The trip is allowed only if certain conditions are fulfilled. One condition is that a trip indicated by the travelling wave detection is allowed if the trip is caused by a sudden change in the current and/or voltage measurement. The travelling wave protection function will thereby be allowed if there is enough high frequency component(s) in the current and/or voltage measurement. Further, allowing the trip may comprise, step S110*d*, causing the circuit breaker to trip. The circuit breaker may be caused to trip by a control command being issued.

There may be different types of transmission line to which the travelling wave protection may be applied. Different embodiments relating thereto will now be described in turn. For example, as disclosed above, the transmission line 20 may be part of a power distribution system 25. The transmission line 20 may either be an alternating current (AC) transmission line or a direct current (DC) transmission line.

The proposed mechanisms for travelling wave protection of a transmission line 20 have been verified by simulations. The structure of the simulated system corresponds to the structure of the power distribution system 25 of FIG. 1. The simulation corresponds to a 100 km length transmission line system operating at a voltage of 245 kV. $F_1$ represents an internal fault with 10Ω resistance at 0.5 s located 50 km from the left-most terminal 24*a*. $F_2$ is in an external fault on the busbar at the right-most terminal 24*b*.

A CVT (Capacitive Voltage Transformer) is used in this simulation model to obtain the voltage measurements. The high frequency component in the voltage measurements decay because of the CVT. Therefore, the proposed mechanisms for travelling wave protection for providing a high frequency blocking function is implemented as being based on current measurements.

The sampling frequency in the simulations is set to 4 kHz. If higher sampling is used, the values of high frequency components for blocking will be even larger and, as a result, the proposed mechanism will have even better performance than show for the present setup.

In the simulations, strong harmonics (including some integer number harmonics and sub-harmonics; the highest order is 11th harmonic) are added to the current measurements test the performance of proposed mechanisms. The harmonics added include the 2nd harmonic (50 A), the 3.5th harmonic (50 A), the 5th harmonic (50 A), and the 11th harmonic (50 A). It should be noted that the presence of harmonics in the simulations is much higher than in practical cases of existing power systems.

Figure 6:
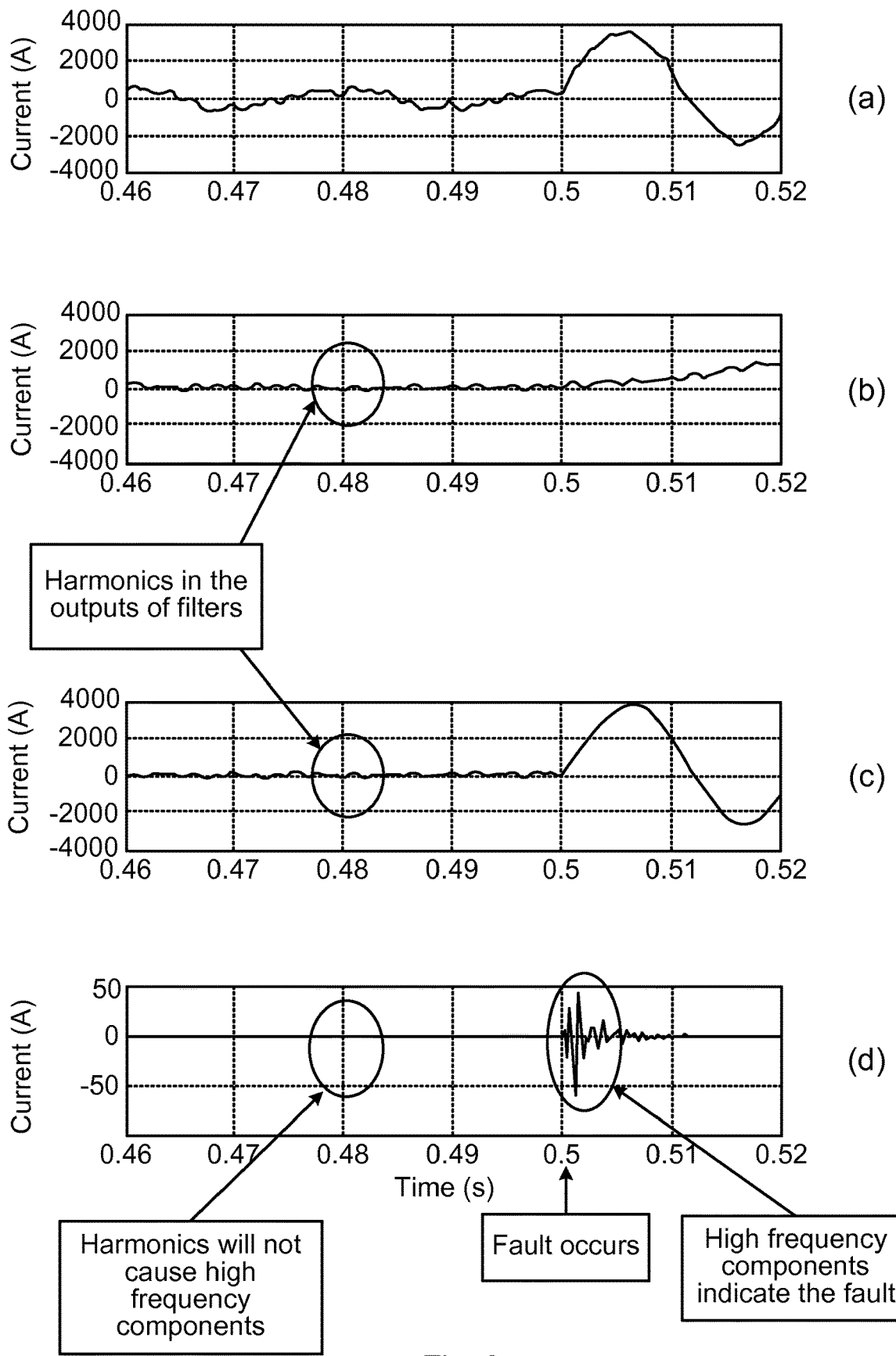
FIG. 6 shows simulation results of travelling wave protection of a transmission line according to embodiments.

Simulation results are provided in FIG. 6. FIG. 6 shows the following four curves (a), (b), (c), (d) from top to bottom:

(a): Original phase-phase current $I_{AB}$ (4 kHz sampling values).

(b): Travelling wave current from $I_{AB}$ State-of-the-art travelling wave detection is used, including a low-pass filter and band-stop filters, to remove harmonics at 50 Hz, 100 Hz, 150 Hz, 200 Hz, 250 Hz and load components.

(c): Travelling wave current from $I_{AB}$. State-of-the-art travelling wave detection is used in combination with high-pass filtering so as to remove harmonics except sub-harmonics.

(d): High frequency current of the original phase-phase current $I_{AB}$ in the range 650 Hz to 2 k Hz as obtained through high-pass filtering.

Observations from the simulation results will now be summarized.

State-of-the-art travelling wave detection can remove the harmonics covered by its band-stop filters, including 50 Hz, the 2nd harmonic, the 3rd harmonic, the 4th harmonic, and the 5th harmonic.

State-of-the-art travelling wave detection cannot remove harmonics which are not covered by its band-stop filters, including the 3.5th harmonic and the 11th harmonic. The 3.5th harmonic and which leads to the results that some harmonics remain in the output of the State-of-the-art travelling wave detection in (b) also before the fault occurs. This output by harmonics before the fault occurs may lead to mal-trip, if there is no special mechanism to deal with this condition.

The proposed travelling wave detection can remove all the whole integer number harmonics (2, 3, 4, 5, 6, . . . ), but it cannot remove sub-harmonics (the 3.5th harmonic).

The proposed travelling wave detection can remove the 50 Hz load current and retain the 50 Hz fault component. State-of-the-art travelling wave detection removes both the 50 Hz load current and the 50 Hz fault component. As a result, the proposed travelling wave detection has a larger output during fault conditions. This means that a fault detection function mechanism using the proposed travelling wave detection will have a better sensitivity and a better reliability than for state-of-the-art travelling wave detection.

Harmonics will not influence the output of the high-pass filter. The output of the high-pass filter is almost zero before the fault occurs. During the fault conditions (i.e., during the time when the fault occurs), the high-pass filter will output a large current immediately as shown in (d) where the fault occurs. This result can be used to trigger blocking/unblocking of the travelling wave output.

Figure 3A:
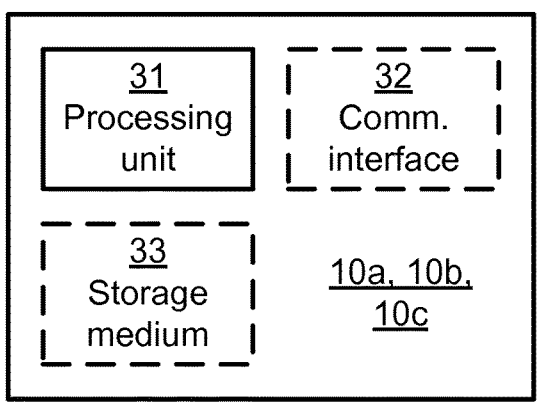
FIG. 3a is a schematic diagram showing functional units of an arrangement according to an embodiment.

FIG. 3a schematically illustrates, in terms of a number of functional units, the components of an arrangement 10a, 10b, 10c for travelling wave protection of a transmission line according to an embodiment. A processing unit 31 is provided using any combination of one or more of a suitable central processing unit (CPU), multiprocessor, microcontroller, digital signal processor (DSP), application specific integrated circuit (ASIC), field programmable gate arrays (FPGA) etc., capable of executing software instructions stored in a computer program product 41 (as in FIG. 4), e.g. in the form of a storage medium 33. Thus the processing unit 31 is thereby arranged to execute methods as herein disclosed. The storage medium 33 may also comprise persistent storage, which, for example, can be any single one or combination of magnetic memory, optical memory, solid state memory or even remotely mounted memory.

The arrangement 10a, 10b, 10c may further comprise a communications interface 32. As such the communications interface 32 may comprise one or more transmitters and receivers, comprising analogue and digital components for communications with at least one other arrangement 10a, 10b, 10c, at least one of current and voltage transformer 22a, 22b, and at least one circuit breaker 23a, 23b.

The processing unit 31 controls the general operation of the arrangement 10a, 10b, 10c e.g. by sending data and control signals to the communications interface 32 and the storage medium 33, by receiving data and reports from the communications interface 32, and by retrieving data and instructions from the storage medium 33. Other components, as well as the related functionality, of the arrangement 10a, 10b, 10c are omitted in order not to obscure the concepts presented herein.

The arrangement 10a, 10b, 10c may be implemented in an electronic device. For example, at least the processing unit 31 may be part of an Intelligent Electronic Device (IED) such as a protective relay, comprised in the arrangement 10a, 10b, 10c. Hence, such an electronic device may be configured to perform any step as herein disclosed. Hence, the current and/or voltage measurement may be acquired by a protective relay placed at one end of the transmission line 20.

Figure 3B:
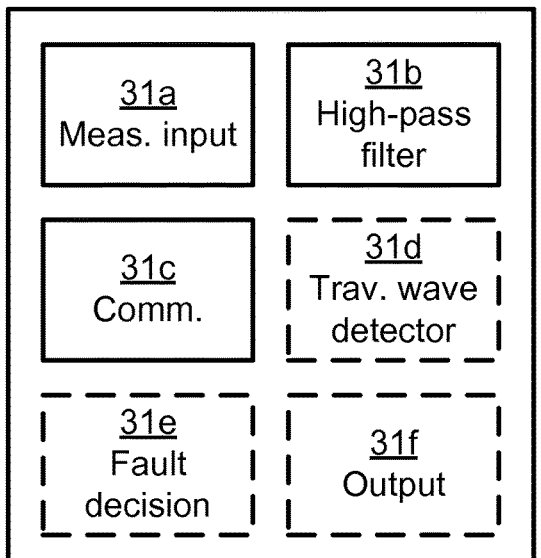
FIG. 3b is a schematic diagram showing functional modules of a protection device according to an embodiment.

FIG. 3b schematically illustrates, in terms of a number of functional modules, the components of an arrangement 10a, 10b, 10c embodied as a travelling wave protection mechanism according to an embodiment. The arrangement 10a, 10b, 10c of FIG. 3b comprises a number of functional modules; a measurement input module 31a, a high-pass filter module 31b, a communications module 31c, a travelling wave detector module 31d, a fault decision module 31e, and an output module 31f.

The measurement input module 31a is configured to receive local current and/or voltage measurements of the transmission line 20. The high-pass filter module 31b is configured to perform high-pass filtering of the current and/or voltage measurement. The communications module 31c is configured to provide a result of the high-pass filtering to the fault decision module 31e. The travelling wave detector module 31d is configured to perform travelling wave detection on the current and/or voltage measurement. The communications module 31c is configured to provide a result of the travelling wave detection to the fault decision module 31e. The fault decision module 31e is configured to make a trip decision based on input received from the high-pass filter module 31b and the travelling wave detector module 31d and the information of other terminals via the communications module 31c. The output module 31f is configured to send the trip decision to a circuit breaker 23a, 23b.

In general terms, each functional module 31a-31f may be implemented in hardware or in software. Preferably, one or more or all functional modules 31a-31f may be implemented by the processing unit 31, possibly in cooperation with functional units 32 and/or 33. The processing unit 61 may thus be arranged to from the storage medium 33 fetch instructions as provided by a functional module 31a-31f and to execute these instructions, thereby performing any steps S102-S110d as disclosed above.

Figure 4:
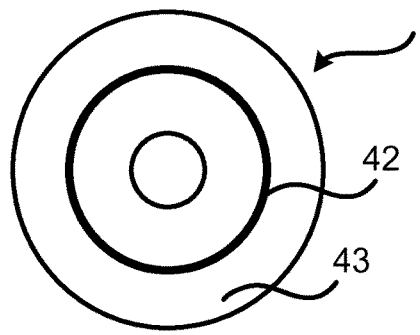
FIG. 4 shows one example of a computer program product comprising computer readable means according to an embodiment.

FIG. 4 shows one example of a computer program product 41 comprising computer readable means 43. On this computer readable means 43, a computer program 42 can be stored, which computer program 42 can cause the processing unit 31 and thereto operatively coupled entities and devices, such as the communications interface 32 and the storage medium 33, to execute methods according to embodiments described herein. The computer program 42 and/or computer program product 41 may thus provide means for performing any steps as herein disclosed.

In the example of FIG. 4, the computer program product 41 is illustrated as an optical disc, such as a CD (compact disc) or a DVD (digital versatile disc) or a Blu-Ray disc. The computer program product 41 could also be embodied as a memory, such as a random access memory (RAM), a read-only memory (ROM), an erasable programmable read-only memory (EPROM), or an electrically erasable programmable read-only memory (EEPROM) and more particularly as a non-volatile storage medium of a device in an external memory such as a USB (Universal Serial Bus) memory or a Flash memory, such as a compact Flash memory. Thus, while the computer program 42 is here schematically shown as a track on the depicted optical disk, the computer program 42 can be stored in any way which is suitable for the computer program product 41.

The inventive concept has mainly been described above with reference to a few embodiments. However, as is readily appreciated by a person skilled in the art, other embodiments than the ones disclosed above are equally possible within the scope of the inventive concept, as defined by the appended patent claims.

The invention claimed is:

1. A method for travelling wave protection of a transmission line, the method comprising:
    performing high-pass filtering of a current and/or voltage measurement of a transmission line so as to detect fault-caused high-frequency components of said current and/or voltage measurement, wherein the high-pass filtering has a cut-off frequency which is higher than the highest frequency of harmonics of the current and/or voltage measurement; and
    providing a result of said high-pass filtering as input to a trip decision maker performing travelling wave protection.

2. The method according to claim 1, further including:
    performing travelling wave detection of the transmission line based on said current and/or voltage measurement; and
    providing a result of said travelling wave detection as input to said trip decision maker.

3. The method according to claim 2, further including:
    making a trip decision based on the result of the travelling wave detection and the result of the high-pass filtering.

4. The method according to claim 1, wherein the trip decision relates to whether or not to cause a circuit breaker to trip.

5. The method according to claim 3, wherein making the trip decision includes:
    blocking a trip if said trip is caused by harmonics of said current and/or voltage measurement.

6. The method according to claim 5, wherein blocking the trip includes:
    preventing the circuit breaker from tripping.

7. The method according to claim 3, wherein making the trip decision includes:
    allowing a trip indicated by the travelling wave detection if said trip is caused by a sudden change in said current and/or voltage measurement.

8. The method according to claim 4, wherein allowing the trip includes:
    causing the circuit breaker to trip.

9. The method according to claim 1, wherein the travelling wave detection uses a travelling wave protection mechanism, RALDA, filter.

10. The method according to claim 1, wherein the transmission line is part of a power distribution system.

11. The method according to claim 1, wherein the transmission line is an alternating current, AC, transmission line.

12. The method according to claim 1, wherein the transmission line is a direct current, DC, transmission line.

13. The method according to claim 1, wherein said current and/or voltage measurement is acquired by a protective relay placed at one end of the transmission line.

14. An arrangement for travelling wave protection of a transmission line, the arrangement including a processing unit, the processing unit being configured to cause the arrangement to:
    perform high-pass filtering of a current and/or voltage measurement of a transmission line so as to detect fault-caused high-frequency components of said current and/or voltage measurement, wherein the high-pass filtering has a cut-off frequency which is higher than the highest frequency of harmonics of the current and/or voltage measurement; and
    provide a result of said high-pass filtering as input to a trip decision maker performing travelling wave protection.

15. The arrangement according to claim 14, the processing unit further being configured to cause the arrangement to:
    perform travelling wave detection of said current and/or voltage measurement of the transmission line; and
    provide a result of said travelling wave detection as input to said trip decision maker.

16. The arrangement according to claim 14, the processing unit further being configured to cause the arrangement to:
    make a trip decision based on the result of the travelling wave detection and the result of the high-pass filtering.

17. The arrangement according to claim 14, wherein the processing unit is part of an Intelligent Electronic Device, IED, included in the arrangement.

18. The method according to claim 4, wherein making the trip decision includes:
    blocking a trip if said trip is caused by harmonics of said current and/or voltage measurement.

19. The arrangement according to claim 15, the processing unit further being configured to cause the arrangement to:
    make a trip decision based on the result of the travelling wave detection and the result of the high-pass filtering.

* * * * *